United States Patent
Mohsenian

(10) Patent No.: US 9,709,611 B1
(45) Date of Patent: Jul. 18, 2017

(54) MULTIPLE ELECTRIC SOCKET POWER STRIP WITH POWER METER

(71) Applicant: Ali Mohsenian, Irvine, CA (US)

(72) Inventor: Ali Mohsenian, Irvine, CA (US)

( * ) Notice: Subject to any disclaimer, the term of this patent is extended or adjusted under 35 U.S.C. 154(b) by 362 days.

(21) Appl. No.: 14/595,328

(22) Filed: Jan. 13, 2015

(51) Int. Cl.
*G01R 21/00* (2006.01)
*G08B 21/18* (2006.01)
*G08B 3/10* (2006.01)
*G08B 5/22* (2006.01)

(52) U.S. Cl.
CPC .............. *G01R 21/00* (2013.01); *G08B 3/10* (2013.01); *G08B 5/22* (2013.01); *G08B 21/185* (2013.01)

(58) Field of Classification Search
None
See application file for complete search history.

(56) References Cited

U.S. PATENT DOCUMENTS

| | | | |
|---|---|---|---|
| 7,324,006 B2 | 1/2008 | Godard | |
| 7,677,921 B2 * | 3/2010 | Czarnecki | G01R 1/0408 439/517 |
| 7,964,994 B2 | 6/2011 | DuBose | |
| 8,221,154 B1 | 7/2012 | Paquette | |
| 8,368,379 B2 | 2/2013 | Gruetter | |
| 8,622,756 B2 | 1/2014 | Smed | |
| D701,834 S | 4/2014 | Lee | |
| 2005/0275371 A1 * | 12/2005 | Bersiek | G01R 22/06 320/111 |
| 2008/0094210 A1 * | 4/2008 | Paradiso | H04L 12/2827 340/540 |
| 2008/0265677 A1 | 10/2008 | Chiang | |
| 2011/0109301 A1 * | 5/2011 | Johnson | H01R 13/6633 324/119 |
| 2011/0215794 A1 * | 9/2011 | Gruetter | G01R 19/00 324/76.11 |
| 2013/0015714 A1 | 1/2013 | Kwok | |
| 2013/0169049 A1 * | 7/2013 | Lo | H01R 25/003 307/39 |
| 2013/0317770 A1 | 11/2013 | Soneda | |

\* cited by examiner

*Primary Examiner* — Jermele M Hollington

(57) ABSTRACT

The multiple electric socket power strips with power meter is a power strip with a power measurement device or circuit adapted to determine the power consumption of the devices connected to the power strip. The multiple electric socket power strips with power meter comprises a cord, a plurality of electric sockets, a power measurement device, an optional on-off switch, and an optional overcurrent alarm circuit.

7 Claims, 3 Drawing Sheets

MULTIPLE ELECTRIC SOCKET POWER STRIP WITH POWER METER

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

The present invention relates to the field of equipment for the distribution of energy, more specifically, an electrical power strip configured for use with a power meter.

Modern power strips connect to electric sockets in walls both to extend the reach of electric device cords and to provide a plurality of electric sockets for electric devices. Power strips are limited because they do not monitor the power consumption of electric devices. With knowing the power consumption of these electric devices, a user can easily overload an extension cord which poses a fire hazard. Moreover, it is advantageous for a power strip to have a power meter because it helps users to monitor the power usage of their devices which allows the development of more efficient energy management plans.

SUMMARY OF INVENTION

This disclosure addresses the above shortcomings. The multiple electric socket power strip with power meter is a power strip adapted to receive a power measurement device or circuit and an optional overcurrent alarm circuit. The multiple electric socket power strip with power meter comprises a cord, a plurality of electric sockets, a power measurement device, an optional on-off switch, and an optional overcurrent alarm circuit.

These together with additional objects, features and advantages of the multiple electric socket power strip with power meter will be readily apparent to those of ordinary skill in the art upon reading the following detailed description of the presently preferred, but nonetheless illustrative, embodiments when taken in conjunction with the accompanying drawings.

In this respect, before explaining the current embodiments of the multiple electric socket power strip with power meter in detail, it is to be understood that the multiple electric socket power strip with power meter is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the multiple electric socket power strip with power meter.

It is therefore important that the claims be regarded as including such equivalent construction insofar as they do not depart from the spirit and scope of the multiple electric socket power strip with power meter. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

Figure 1:
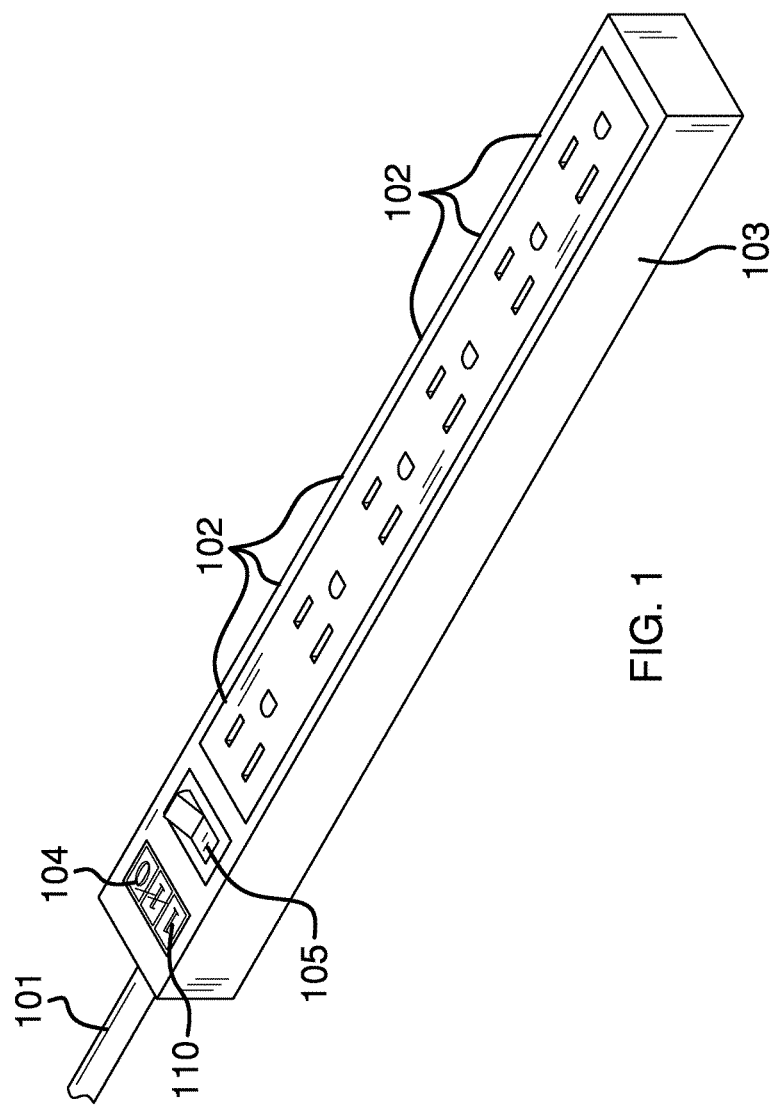
FIG. 1 is an isometric view of an embodiment of the disclosure.

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

In the specification and claims, the following definitions will be used:

Cord: As used in this disclosure, a cord is a flexible electrically conductive cable that is used to transfer electrical power from an electric socket to an electric device. A cord has a first end and a second end. The first end is terminated with an electrically conductive connection to a plug. The second end is terminated with an electrically conductive connection to the device that requires electrical power.

Power Strip: As used in this disclosure, a power strip is a plurality of electric sockets that are connected as the electrical device to a cord. The purposes of a power strip are: 1) to allow multiple devices to be powered from a single electrical socket; and 2) to extend the reach of the cord of an electric device.

Extension Cord: As used in this disclosure, an extension cord is a cord that is fitted with a single electric socket as the electric device that is used to make a second cord reach farther. In this disclosure, an extension cord is considered to be a special case of a power strip with a single electric socket.

Electric Device: As used in this disclosure, an electric device is a device that requires electric power to operate.

Plug: As used in this disclosure, a plug is an electric device that is an electric connector attached to cord. A plug has protruding prongs, blades, or pins (referred to as male) that fit into matching slots or holes (referred to as female) of an electric socket.

Electric Socket: As used in this disclosure, an electric socket is a receptacle into which a plug can be inserted. The electric socket is connected to an energized electrical circuit and the plug being inserted into an electric socket receives electrical power from the electric socket. An electric socket has slots or holes (referred to as female) into which the prongs, blades, or pins (referred to as male) of a plug can be inserted.

Detailed reference will now be made to a first potential embodiment of the disclosure, which is illustrated in FIGS. 1 through 4.

The multiple electric socket power strip 100 (hereinafter invention) comprises a cord 101, a plurality of electric sockets 102, a power measurement device 104, an optional on-off switch 105, an optional overcurrent alarm circuit 106, and a housing 103.

The power measurement device 104 comprises a current transformer 107, a terminating resistor 108, a measurement circuit 109 and a display. The current transformer 107 is a device that uses the changing magnetic field of an originating ac current to induce a proportional current in a secondary circuit. In this invention 100, this proportional current is used to measure the amperage of the original ac current. The terminating resistor 108 provides the closed circuit that allows the induced proportional current to flow. The flow of the induced proportional current through the terminating resistor 108 generates a measurable voltage that is proportional to the originating ac current. The resistance of the selected terminating resistor 108 should be significantly less than the input impedance of the load terminals of the measurement circuit 109.

Figure 2:
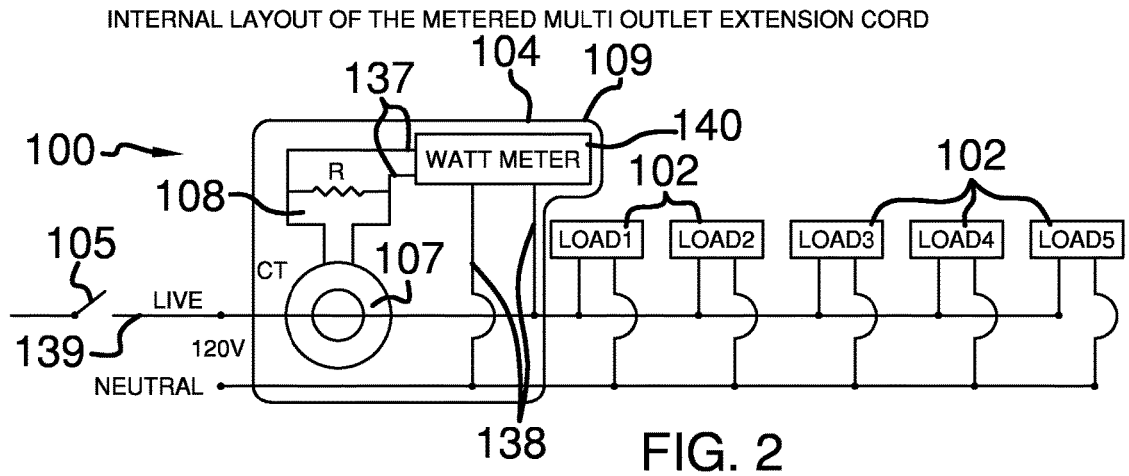
FIG. 2 is a schematic overview of an embodiment of the disclosure.

In the first potential embodiment illustrated in FIG. 2, the measurement circuit 109 is a wattmeter 140 with an LCD display 110. The wattmeter 140 comprises a load input 137, a voltage input 138, and a liquid crystal display 110 (LCD). The load input 137 is connected at the terminating resistor 108. The voltage input 138 is terminated across the input voltage received by the invention 100 through the cord 101. The wattmeter 140 then processes these two inputs to estimate the power being consumed by the electrical devices that are connected to the plurality of electric sockets 102. In the first potential embodiment, the wattmeter 140 then displays the estimated watt consumption on the LCD display 110.

Figure 4:
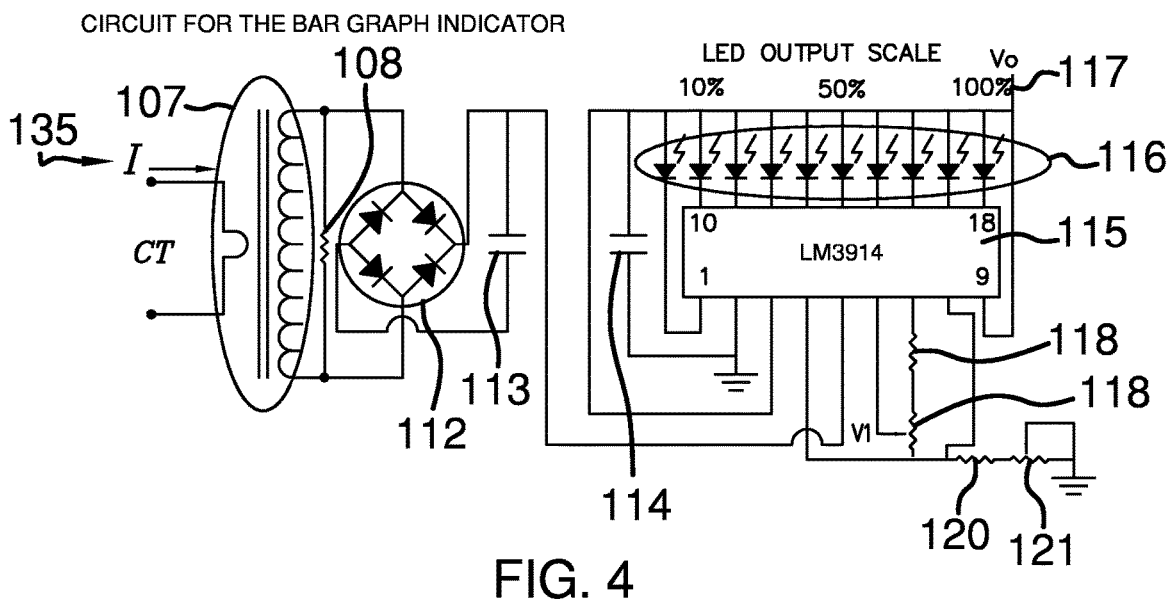
FIG. 4 is a schematic view of a detail of an embodiment of the disclosure.

In a second potential embodiment, illustrated in FIG. 4, the measurement circuit 109 is a light emitting diode (LED) display circuit 135 that comprises a first full wave rectifier 112, a second capacitor 113, a third capacitor 114, a dot bar display driver integrated circuit (IC) 115, a plurality of display LEDs 116, a first dc power supply voltage 117, a first reference resistor 118, a second reference resistor 119, a third bias resistor 120, and a fourth bias resistor 121.

The purpose of the light emitting diode (LED) display circuit 135 is to use the plurality of LEDs 116 to display a visual representation of the percentage of the energy capacity of the invention 100 that is being used.

The purpose of the first full wave rectifier 112 is to convert the ac voltage generated by the voltage at the terminating resistor 108 to a dc signal. The purpose of the second capacitor 113 is to smooth the output of the first full wave rectifier 112 to a stable representative current level.

The smoothed voltage is then fed into the input of a dot bar display driver IC 115. The dot bar display driver IC 115 is a monolithic IC that takes an analog voltage signal and drives a plurality of display LEDs 116. In the second potential embodiment, ten display LEDs 116 are driven by the dot bar display driver IC 115. The dot bar display driver IC 115 has an internal 10 step voltage divider that is used to determine the appropriate number of display LEDs to display power given the input voltage. The 10 step voltage divider compares the input voltage to a reference voltage. The reference voltage is provided from a voltage divider made from the first reference resistor 118 and the second reference resistor 119. The third bias resistor 120 and fourth bias resistor 121 are added to compensate for temperature related performance variation of the dot bar display driver IC 115. In the second embodiment, the fourth bias resistor 121 is a potentiometer. The purpose of the third capacitor 114 is to suppress noise that may be from the leads running feeding the dot bar display driver IC 115

After the voltage level is determined by the dot bar display driver IC 115, the dot bar display driver IC 115 operates a series of internal switches and resistors that turn on and off each of the ten display LEDs 116 to appropriately represent the power level.

The dot bar display driver IC 115 is powered from a first dc power supply voltage 117 that is drawn, conditioned, and regulated from the power entering the invention 100. Voltage regulation circuits are well known and documented in the art.

Figure 3:
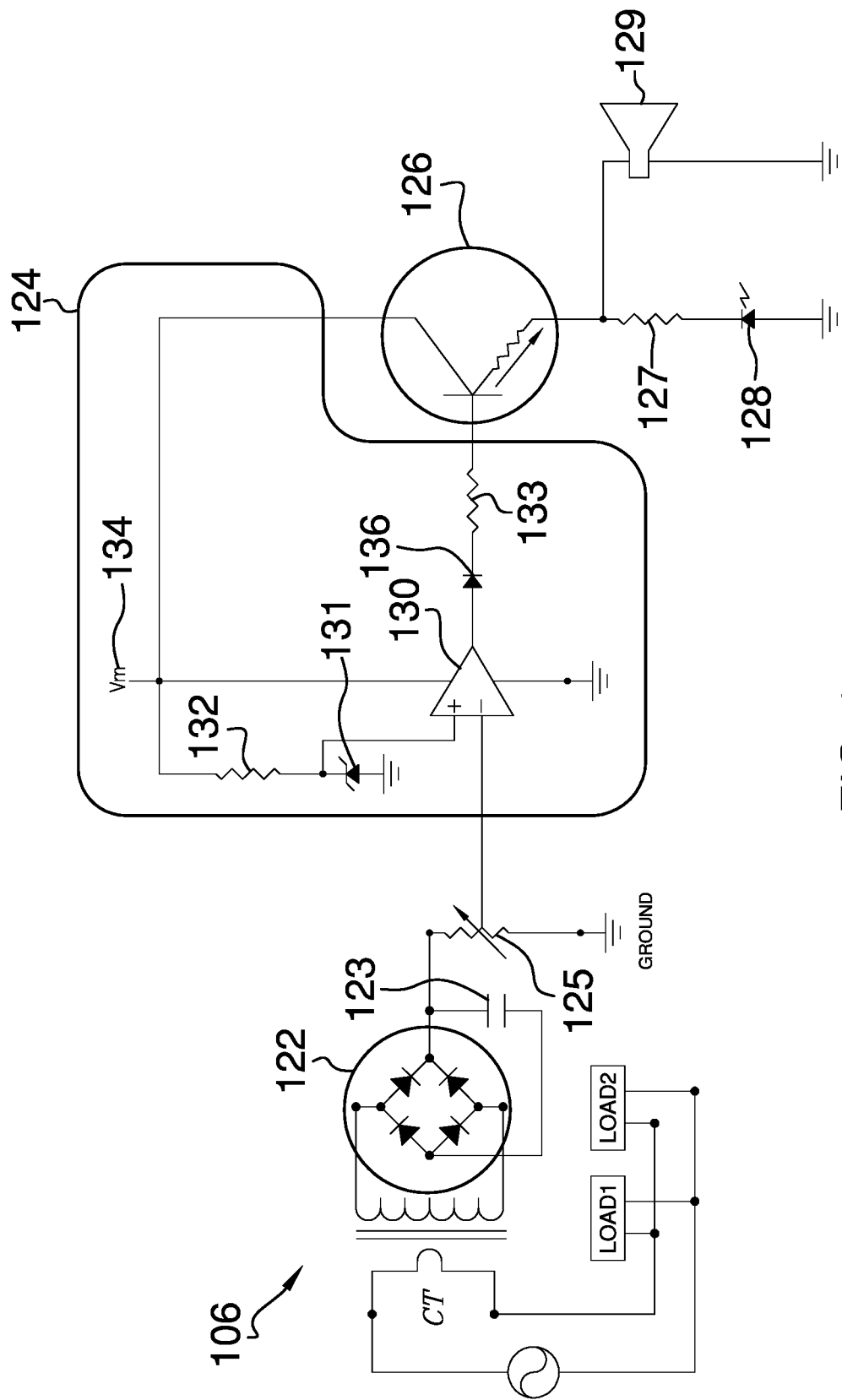
FIG. 3 is a schematic view of a detail of an embodiment of the disclosure.

As illustrated in FIG. 3, the optional overcurrent alarm circuit 106 comprises a second full wave rectifier 122, a first capacitor 123, a potentiometer 125, a comparator circuit 124, a switching transistor 126, a fifth pull up resistor 127, an alarm LED 128, an alarm buzzer 129, and a dc power supply voltage 134.

The operation of the optional overcurrent alarm circuit 106 is as follows: The second full wave rectifier 122, first capacitor 123, and potentiometer 125 combine to generate a voltage signal that is proportional to the current running through the invention 100. This generated voltage signal is input to the comparator circuit 124 which compares the generated voltage signal to a reference voltage. If the generated voltage signal is less than the reference voltage than positive voltage is fed to the base of the transistor 126 which closes the transistor 126 to current flow. When the generated voltage signal goes above the reference voltage, the positive voltage is removed from the base of the transistor 126 which opens the transistor 126 to current flow and provides power to the fifth pull up resistor 127, alarm LED 128 and alarm buzzer 129.

The purpose of the second full wave rectifier 122 is to convert the ac voltage generated by the voltage at the terminating resistor 108 to a dc signal. The purpose of the first capacitor 123 is to smooth the output of the second full wave rectifier 122 to a stable current level proportional to the current flowing through the invention 100. The potentiometer 125 can be used to tune the circuit.

The comparator circuit 124 comprises an operational amplifier 130, a zener diode 131, a sixth pull up resistor 132 a seventh load resistor 133 and a diode 136. The operational amplifier 130 is configured as a basic comparator circuit with the reference voltage connected to the positive input of the operational amplifier 130 and the generated voltage signal is connected to the negative input of the operational amplifier 130.

The reference voltage is provided by a zener diode 131 with a breakdown voltage selected for the purpose. The zener diode 131 is protected by a sixth pull up resistor 132 which limits current flow from the second dc power supply voltage 134 through the zener diode 131 to ground. A seventh load resistor 133 is inserted between the operational amplifier 130 and the base of the transistor 126. A diode 136 is inserted between the operational amplifier 130 and the base of the transistor 126 to prevent current leakage into the operational amplifier 130.

Power to operate the operational amplifier 130 and the zener diode 131 is supplied from the second dc power supply voltage 134 that is drawn, conditioned, and regulated from the power entering the invention 100. Voltage regulation circuits are well known and documented in the art.

The second dc power supply voltage 134 also supplies power to the alarm circuitry. The second dc power supply voltage 134 is connected to the collector of the transistor 126. When the transistor 126 switches to the closed position, current flows through the transistor 126 and through the fifth pull up resistor 127 and alarm LED 128. The alarm LED 128 lights up which visually indicates an overcurrent alarm. The purpose of the fifth pull up resistor 127 is to limit current flow from the second dc power supply voltage 134 through the alarm LED 128. When the transistor 126 switches to the closed position, current also flows through an alarm buzzer 129 which audibly indicates an overcurrent alarm.

In a third potential embodiment both the alarm LED 128 and the alarm buzzer 129 are provided. In a fourth potential embodiment, only an alarm LED 128 is provided. In a fifth potential embodiment only an alarm buzzer 129 is provided. In a sixth potential embodiment no overcurrent alarm is provided.

The optional on-off switch 105 is a rocker switch placed in the live line 139 between the termination of the cord 101 in the invention 100 and the current transformer 107. The purpose of the optional on-off switch 105 is to disconnect the power to the invention 100.

The housing 103 is the structure that contains and securely holds the plurality of electric sockets 102, the power measurement device 104, the optional on-off switch 105, the optional overcurrent alarm circuit 106, the circuits to provide any necessary dc power supply voltages, and other associated components and wiring.

The external appearance of the first potential embodiment is illustrated in FIG. 1. As shown in FIG. 1, the power cord 101 is connected to the invention 100. The first potential embodiment also includes the use of a wattmeter 140 with an LCD display 110 as the power measurement device 104. The optional on-off switch 105 is provided as well as six electric sockets 102.

To manufacture the invention 100:

The cord 101 and plurality of electric sockets 102 used are commercially available.

The wattmeter 140 used is commercially available.

The current transformer 107 used is commercially available.

The terminating resistor 108 used is a commercially available temperature stabilized precision resistor.

All the remaining resistors as well as potentiometers, transistors, diodes, zener diodes, light emitting diodes and capacitors used are commercially available.

The dot bar display driver IC 115 used is commercially available.

The operational amplifier 130 used is commercially available.

The housing 103 is made of molded plastic. Suitable plastic includes, but is not limited to, polyethylene.

A single voltage regulator circuit can serve the function of the first dc power supply voltage 117 and second dc power supply voltage 134.

A single full wave rectifier can serve the function of the first full wave rectifier 112 and the second full wave rectifier 122.

A single capacitor can serve the function of the first capacitor 123 and the second capacitor 113.

With respect to the above description, it is to be realized that the optimum dimensional relationship for the various components of the invention described above and in FIGS. 1 through 4, include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. A power strip with a power meter comprising:
a cord;
at least one electric socket;
a power measurement device;
an optional on-off switch;
and a housing;
wherein the power measurement device comprises a current transformer, a terminating resistor, a measurement circuit and a display;
wherein the measurement circuit is a wattmeter;
wherein the measurement circuit is an light emitting diode display circuit that comprises a first full wave rectifier, a second capacitor, a third capacitor, a dot bar display driver integrated circuit, a plurality of display LEDs, a first dc power supply voltage, a first reference resistor, and a second reference resistor;
wherein an overcurrent alarm circuit is further defined with a second full wave rectifier, a first capacitor, a comparator circuit, a switching transistor, a fifth pull up resistor, an alarm device a second dc power supply voltage.

2. The power strip with a power meter according to claim 1 wherein the comparator circuit is further defined with an operational amplifier, a zener diode, a sixth pull up resistor a seventh load resistor and a diode.

3. The power strip with a power meter according to claim 2 wherein the alarm device is a light emitting diode.

4. The power strip with a power meter according to claim 2 wherein the alarm device is an audible buzzer.

5. The power strip with a power meter according to claim 3 wherein an on-off switch is provided to disconnect the power strip with a power meter from an external electric power source.

6. The power strip with a power meter according to claim 4 wherein an on-off switch is provided to disconnect the power strip with a power meter from an external electric power source.

7. The power strip with a power meter according to claim 1 wherein an overcurrent alarm circuit is further defined with a second full wave rectifier, a first capacitor, a comparator circuit, a switching transistor, a fifth pull up resistor, an alarm device a second dc power supply voltage.

* * * * *